United States Patent [19]
Ferraiolo et al.

[11] Patent Number: 6,038,254
[45] Date of Patent: *Mar. 14, 2000

[54] ADAPTIVE FILTERING METHOD AND APPARATUS TO COMPENSATE FOR A FREQUENCY DIFFERENCE BETWEEN TWO CLOCK SOURCES

[75] Inventors: Frank David Ferraiolo, Essex Junction, Vt.; Joseph Michael Hoke, Millerton; Samir Kirit Patel, Wappingers Falls, both of N.Y.

[73] Assignee: International Business Machines Corporation, Armonk, N.Y.

[ * ] Notice: This patent is subject to a terminal disclaimer.

[21] Appl. No.: 09/090,026

[22] Filed: Jun. 10, 1998

Related U.S. Application Data

[63] Continuation of application No. 08/660,648, Jun. 7, 1996.
[51] Int. Cl.$^7$ .............................. H03H 7/30; H03H 7/40
[52] U.S. Cl. ...................... 375/232; 375/327; 375/362; 327/39
[58] Field of Search .................................. 375/316, 326, 375/327, 344, 232, 354, 362; 327/23, 24, 39, 40; 455/182.2, 182.1

[56] References Cited

U.S. PATENT DOCUMENTS

| | | | |
|---|---|---|---|
| 4,280,224 | 7/1981 | Chethik | 375/116 |
| 4,594,727 | 6/1986 | Pierce | 375/83 |
| 4,667,333 | 5/1987 | Butcher | 375/106 |
| 4,780,844 | 10/1988 | Keller | 364/900 |
| 4,791,386 | 12/1988 | Shiga | 331/1 A |
| 4,847,870 | 7/1989 | Butcher | 375/87 |
| 4,918,709 | 4/1990 | Fitch | 375/82 |
| 4,972,444 | 11/1990 | Melrose et al. | 375/120 |
| 5,052,026 | 9/1991 | Walley | 375/119 |
| 5,162,746 | 11/1992 | Ghoshal | 328/155 |
| 5,231,650 | 7/1993 | Satomura | 375/95 |
| 5,487,095 | 1/1996 | Jordan et al. | 376/371 |
| 5,513,377 | 4/1996 | Capowski et al. | 395/881 |
| 5,522,088 | 5/1996 | Halma et al. | 395/881 |
| 5,757,297 | 5/1998 | Ferraiolo et al. | 341/100 |
| 5,774,494 | 6/1998 | Sawahashi et al. | 375/207 |
| 5,845,196 | 12/1998 | Nawata | 455/71 |
| 5,854,605 | 12/1998 | Gildea | 342/357 |
| 5,859,881 | 1/1999 | Ferraiolo et al. | 375/350 |

*Primary Examiner*—Chi H. Pham
*Assistant Examiner*—Bryan S. Webster
*Attorney, Agent, or Firm*—Lawrence D. Cutter, Esq.; Heslin & Rothenberg, P.C.

[57] ABSTRACT

Frequency differences between differing clock sources are compensated for by an adaptive filtering mechanism. An amount of frequency drift between two clock sources is determined. Then, based on that amount of frequency drift, a filtering value is selected to be used in tracking the frequency drift. If the frequency drift is determined to be large, then a minimum filtering value is selected. However, if it is determined to be small, then a maximum filtering value is selected. The selected filtering value is used to adjust the address(es) of one or more data bits being transmitted and received using the two clock sources, such that the frequency drift is properly tracked.

13 Claims, 8 Drawing Sheets fig. 1 fig. 2 fig. 3a fig. 3b fig. 4 fig. 5 fig. 6 fig. 7 fig. 8 fig. 9

ADAPTIVE FILTERING METHOD AND APPARATUS TO COMPENSATE FOR A FREQUENCY DIFFERENCE BETWEEN TWO CLOCK SOURCES

This application is a continuation application of prior application Ser. No. 08/660,648, filed Jun. 07, 1996, now pending.

CROSS REFERENCE TO RELATED APPLICATION

This application contains subject matter which is related to the subject matter of the following application, which is assigned to the same assignee as this application and filed herewith. The below listed application is hereby incorporated by reference in its entirety:

"Method and Apparatus For Recovering A Serial Data Stream Using A Local Clock," by Ferraiolo et al. (Docket No. PO9-95-048).

TECHNICAL FIELD

This invention relates, in general, to frequency mismatches between two clock sources, and, in particular, to an adaptive filtering mechanism that can be used to compensate for the frequency differences.

BACKGROUND ART

As is known, frequency mismatches can occur whenever two clock sources are being used. In one example, there can be a frequency mismatch between a clock being used in the transmission of data and another clock being used in the receipt of data. This is seen, for instance, in conventional high-speed serial data links.

In one instance, a typical high-speed serial data link includes two transceivers, one on each end of the link. Each transceiver includes a serializing transmitter (a.k.a., a serializer) and a deserializing receiver (a.k.a., a deserializer). The serializer receives as input a parallel data byte, converts the data byte into a stream of serial data bits and transmits the serial data bits over a link to the deserializer in accordance with a transmit clock. The serial data includes the transmit clock information, which is extracted and used to recover the serial data stream and reassemble the parallel byte. Additionally, the deserializer uses the extracted clock information on the receive side as a receive clock to output the parallel data from the deserializer.

Since the extracted transmit clock becomes the receive clock, conventional high-speed serial data links automatically compensate for frequency differences between the transmit and receive clocks. However, this is not the case when the receive clock is not extracted from the transmit clock.

Thus, a need still exists for a mechanism to compensate for frequency differences when the transmit clock and receive clock are not from the same source. Further, a need exists for a mechanism that can dynamically adapt to frequency differences as those differences are detected. A further need exists for an adaptive filtering mechanism that enhances the accuracy and performance of digital phase-locked loops used in the extraction of data from serial data streams.

SUMMARY OF THE INVENTION

The shortcomings of the prior art are overcome and additional advantages are provided through the provision of an adaptive filtering method usable in the transmission and receipt of data. An amount of frequency drift is determined between a first clock used in transmitting data and a second clock used in receiving the data. Then, responsive to the determining, a filtering value is selected to be used in tracking the frequency drift. In one example, the determining includes measuring an amount of time between at least a first wrap procedure and a second wrap procedure to determine how frequently a wrap procedure occurs. The frequency of the wrap procedures indicates an amount of frequency drift.

In one embodiment, the data includes a plurality of data bits and the method further includes tracking the frequency drift using a plurality of edge detectors. Each of the edge detectors determines an edge of one of the data bits.

In a further embodiment of the invention, the determining of the edge includes providing, by the appropriate edge detector, an adjustment to an address of the edge of the data bit. The providing employs the filtering value to determine when to adjust the address.

In one example, the filtering value is provided to a random walk filter prior to the adjustment, and the random walk filter determines when to adjust the address.

In yet another example of the present invention, the filtering value includes a non-symmetric filtering value. The non-symmetric filtering value includes a first value indicating when the address of one or more data bits is to be adjusted in one direction and a second value indicating when the address of one or more data bits is to be adjusted in another direction.

In another embodiment of the invention, an adaptive filtering apparatus is provided. The adaptive filtering apparatus includes means for determining an amount of frequency drift between a first clock used in transmitting data and a second clock used in receiving data, and a selector adapted to select, in response to the determining, a filtering value usable in tracking the frequency drift.

The adaptive filtering method and apparatus of the present invention advantageously enable the dynamic adaptation to frequency mismatches between differing clock sources. The adaptive filtering mechanism of the present invention enables the selection of a filtering value when frequency drift is determined to provide a correct amount of filtering. Additional advantages and features are realized through the techniques of the present invention.

Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention will be apparent from the following detailed description taken in conjunction with the accompanying drawings in which:

BEST MODE FOR CARRYING OUT THE INVENTION

In accordance with the principles of the present invention, a serial data stream is recovered using a local clock. In particular, the serial data stream is recovered using a local clock that is asynchronous to the clock used in transmission of the serial data stream. The local clock used for recovery is not extracted from the data stream nor is it transmitted with the data stream. This is referred to herein as a clockless data stream.

In one embodiment of the present invention, the local clock is used in conjunction with a serializer/deserializer (SERDES) and a digital phase-locked loop (DPLL) to convert a parallel data byte (e.g., 10-bits wide) into a stream of serial data bits, extract the data from the serial data stream and reassemble the data back into a parallel data byte. The SER/DES and DPLL are incorporated into, for instance, a low cost, single chip CMOS module providing certain performance enhancements.

As described in further detail below, the DPLL phase shifts, or delays the incoming serial data stream so that it may be reliably sampled by the fixed local clock. A chosen phase of the data can be sampled reliably with the local clock until the frequency drift between the transmit clock and the local clock creates additional phase error that must be corrected. Typically, the clock drift between the transmit and receive clock is specified implicitly by the data rate of the link, and is, for instance, specified on the order of less than or equal to 200 parts per million (ppm). The present invention includes a technique for correcting such a phase error.

In one embodiment of the invention, a DPLL/SERDES is utilized in a fiber optic link, such as an ESCON link offered by International Business Machines Corporation. One example of such a link is depicted in FIG. 1 and described in detail herein.

Figure 1:
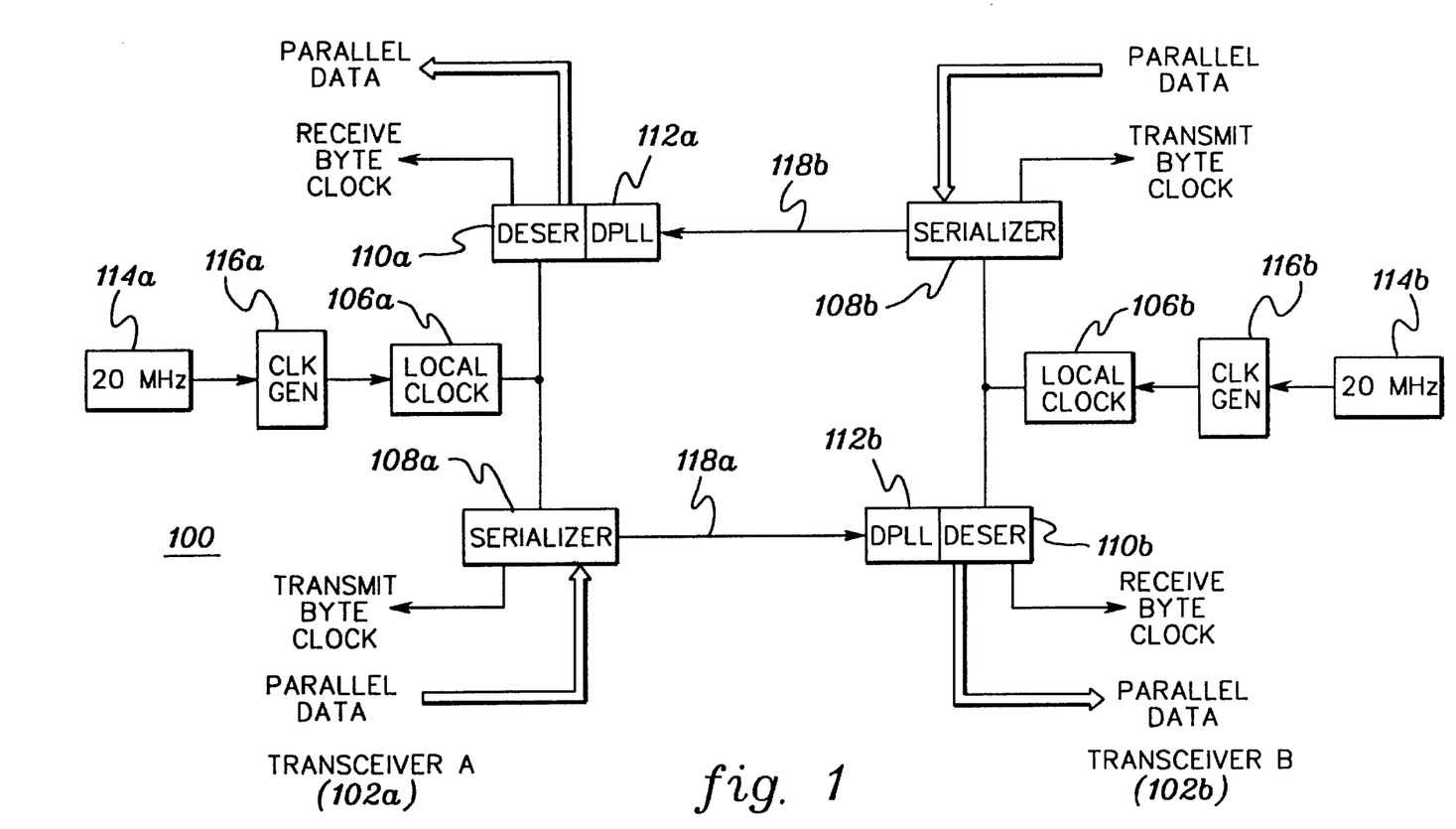
FIG. 1 depicts one example of a serial link incorporating the present invention.

As shown in FIG. 1, a link 100 typically includes a transceiver at each end of the link (e.g., Transceiver A (102a) and Transceiver B (102b)). Each transceiver includes, for instance, a local clock 106a or 106b; a serializer 108a or 108b; a deserializer (DESER) 110a or 110b; and a digital phase-locked loop (DPLL) 112a or 112b, each of which is described in detail below.

In one example, each local clock 106a, 106b is a 100 MHz high-speed clock (HSC) generated from a 20 MHz oscillator 114a, 114b, respectively. Each oscillator is input to a clock generator 116a, 116b (i.e., a multiplier), respectively, which outputs the 100 MHz frequency. (It will be apparent to those skilled in the relevant art that a 20 MHz oscillator is not the only means for generating a 100 MHz clock. For example, a 100 MHz oscillator may be used, as well as any other oscillator which can be used to generate 100 MHz. It will also be apparent that the local clock can be of a frequency different from 100 MHz without departing from the spirit of the present invention.)

Each local clock is coupled to the serializer, deserializer and DPLL of its transceiver. For example, local clock 106a is coupled to serializer 108a, deserializer 110a and DPLL 112a, while local clock 106b is coupled to serializer 108b, deserializer 110b and DPLL 112b.

Each serializer receives parallel data (e.g., 10-bit wide data) from, for instance, a host connected to link 100, and serializes the parallel data into a stream of serial data bits. In accordance with the principles of the present invention, the stream of serial data bits is clockless, meaning that the serial stream is transmitted without any clock signal used in recovery of the serial data. In particular, the recovery clock is not included in the data or transmitted with the data. The stream of serial data is then transmitted over a fiber link from one transceiver to another transceiver in accordance with a transmit byte clock. For example, serializer 108a of Transceiver A receives parallel data from a Host A, serializes the parallel data into a serial data stream and transmits the serial data stream over a fiber link 118a to DPLL 112b of Transceiver B. Likewise, serializer 108b of Transceiver B receives parallel data from a Host B, serializes the parallel data into a serial data stream, and transmits the serial data stream over a fiber link 118b to DPLL 112a.

In accordance with the principles of the present invention, the DPLL partitions its received data into, for example, two-bit samples and presents the samples to its respective deserializer 110a, 110b. The deserializer then completes the conversion of the serial data into parallel data and outputs the parallel data. Additionally, the deserializer also generates a receive byte clock used for presenting the parallel data to, for instance, the ESCON channel logic.

As described above, a typical link has two concurrent data paths, one from Transceiver A to Transceiver B and the other from Transceiver B to Transceiver A. Since each data path includes similar components, for clarity purposes, the invention will be described in detail herein, as it relates to the path from Transceiver B to Transceiver A. It will be understood, however, that the techniques of the present invention are equally applicable to the path originating at Transceiver A and ending at Transceiver B. In particular, deserializer 110b and DPLL 112b will not be explicitly referenced throughout the remainder of the specification, however, it is understood that they may include the same enhancements as deserializer 110a and DPLL 112a.

In accordance with the principles of the present invention, DPLL 112a includes a chain of individual delay elements 200 (FIG. 2), which is used to phase shift the serial data so that the data may be reliably sampled by local clock 106a. In one example, the chain of delay elements includes a number of identical inverters 202 (e.g., 64 inverters) designed in such a way that there are at least two bit times worth of data in the delay chain under all temperature, power supply and CMOS manufacturing process variations. The delay element specifications are determined by considering the best and worst case tolerances of the silicon devices, while considering the tradeoff that is made between the minimum resolution of the individual delay elements versus the total number of delay elements needed in the delay chain. The worst case propagation delay through an element (i.e., the slowest device) determines the minimum resolution of the technique. In one embodiment, a minimum resolution of less than 1/10th of a bit time is desired. Given a 5 nsec bit time, the slowest device speed allowed is 5 nsec divided by 12.5 yielding 400 psec. The best case propagation delay through an element (i.e., the fastest device) determines the maximum number of delay elements needed in the delay chain. Since the delay chain is required, in this embodiment, to accommodate at least two bit times worth of data, and considering the practical limits on the best to worst case tolerances for the silicon devices, a minimum delay element of ⅟₂₅th of a bit time is chosen. Therefore, the fastest device speed accepted is 5 nsec divided by 25, yielding 200 psec. Thus, the delay elements of the present invention are specifically designed to meet these criteria, given an acceptable 2:1 spread for the device tolerances.

Figure 3A:
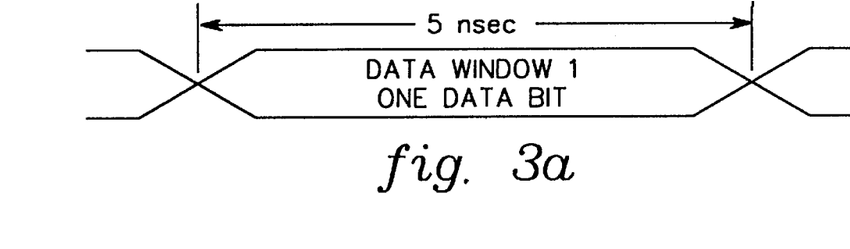
FIGS. 3a–3b depict examples of one and two data windows, respectively, used in accordance with the principles of the present invention.

As described in detail below, the DPLL samples the serial data stream delayed by the inverters and captures data on both the rising edge and falling edge of the local clock (e.g., local clock 106a), thereby partitioning the data into two-bit samples. Thus, if, for example, the local clock is a 10 nsec clock, and one bit time is equal to 5 nsec, then two data bits are captured during each clock cycle. Therefore, each data bit is considered in an active data window for 5 nsec, spanning, for example, 10 delay elements, assuming each delay element is 500 picoseconds (FIG. 3a).

Figure 3B:
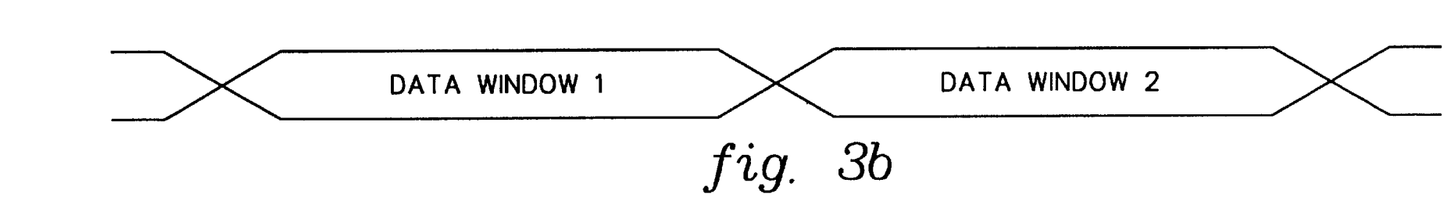

In accordance with the principles of the present invention, two valid data windows are used to track the incoming serial data stream (FIG. 3b). One window is considered active, while the other is used when the active window can no longer adequately track the data, as described below. In one embodiment of the invention, the two data windows are tracked by three edge detectors located within the DPLL. As one example, there is an early edge detector 400 (FIG. 4), a middle edge detector 402, and a late edge detector 404. The early and middle edge detectors track data window 1, and the middle and late edge detectors track data window 2. (Edge detectors are described in detail in U.S. Pat. No. 5,487,095, issued on Jan. 23, 1996, (Attorney Docket No. PO9-93-053A), entitled "Edge Detector", assigned to International Business Machines Corporation, which is hereby incorporated herein by reference in its entirety. Edge detectors are also described in the following patents/patent application, each of which is hereby incorporated herein by reference in its entirety: "Input-Output Element Has Self Timed Interface Using A Received Clock Signal To Individually Phase Aligned Bits Received From A Parallel Bus," by Capowski et al., U.S. Pat. No. 5,513,377, assigned to International Business Machines Corporation (Docket No. PO9-93-057), Issued: Apr. 30, 1996; "A Shared Channel Subsystem Has A Self Timed Interface Using A Received Clock Signal To Individually Phase Align Bits Received From A Parallel Bus," by Halma et al., U.S. Pat. No. 5,522,088, assigned to International Business Machines Corporation (Docket No. PO9-93-060), Issued: May 28, 1996; and "Self Timed Interface," by Ferraiolo et al., application Ser. No. 08/452,445, assigned to International Business Machines Corporation (Docket No. PO9-93-054B), Filed: May 26, 1995.)

Figure 2:
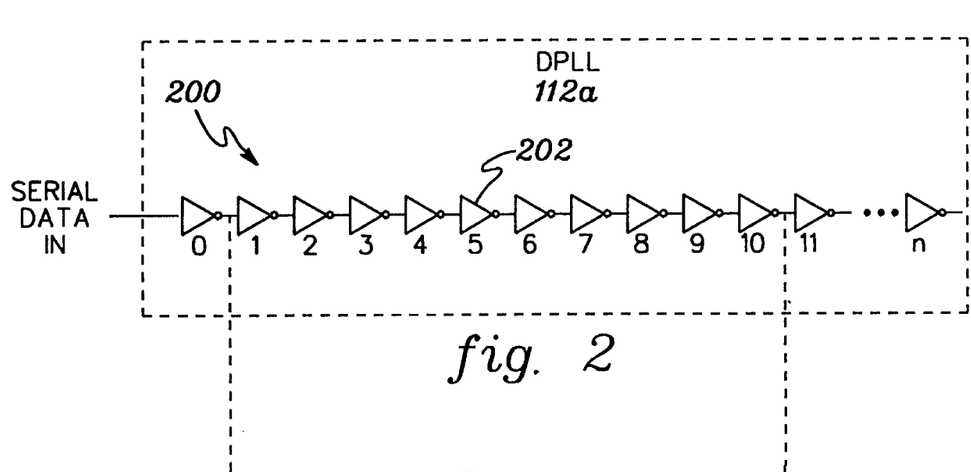
FIG. 2 illustrates one embodiment of a delay chain used for phase shifting the data, in accordance with the principles of the present invention.

In order to track the data windows and to capture the 2-bit wide data samples to be passed to the deserializer (e.g., deserializer 110a), various edge and data samples are taken from delay chain 200. These samples are selected based on, for instance, a plurality of edge and data address registers.

Figure 4:
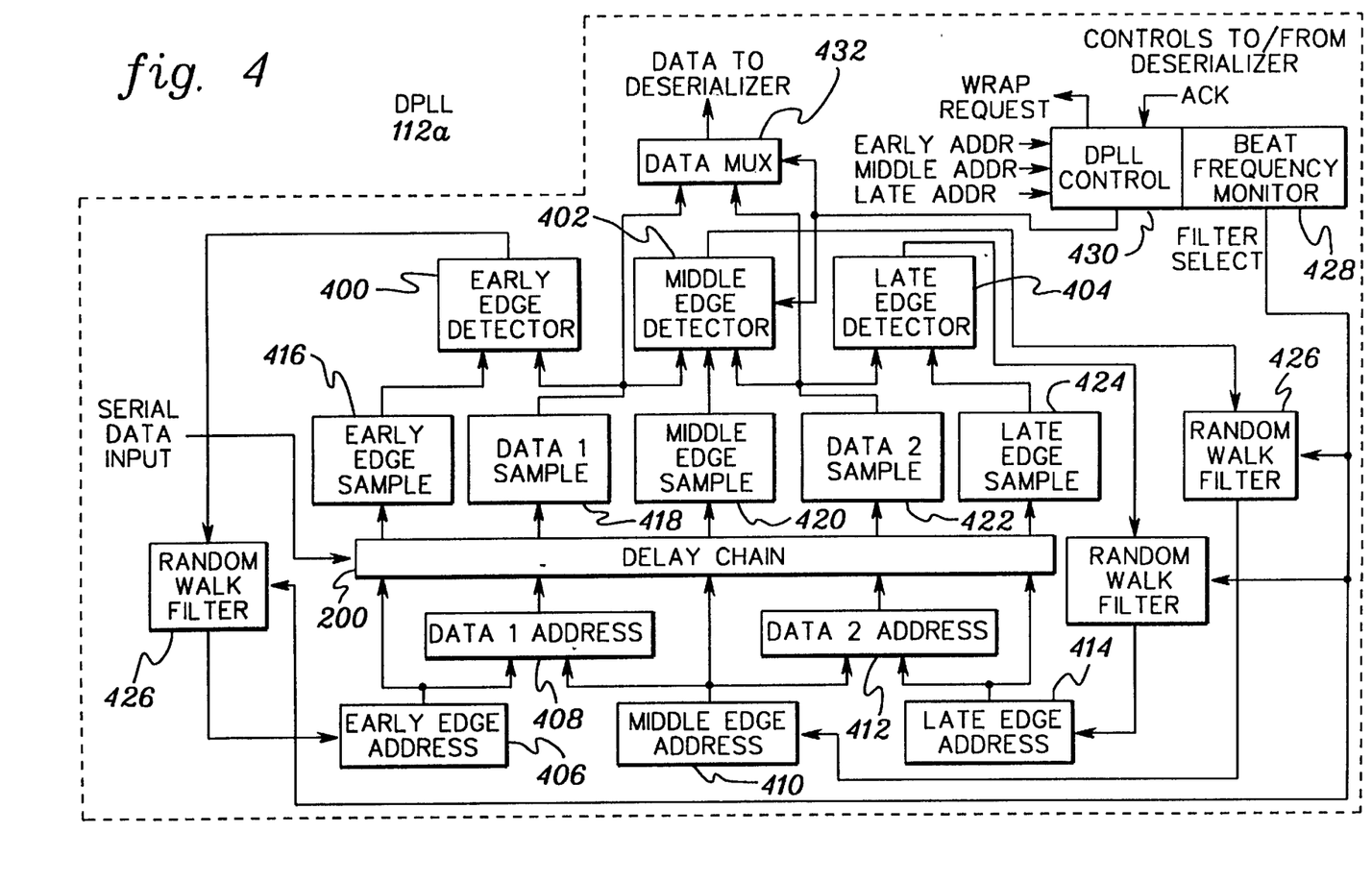
FIG. 4 depicts one embodiment of a digital phase-locked loop of the serial link of FIG. 1 incorporating the principles of the present invention.

For example, in one embodiment, DPLL 112a includes an early edge address register 406, a data 1 address register 408, a middle edge address register 410, a data 2 address register 412 and a late edge address register 414. Each of the address registers is input to the delay chain of inverters and used to select corresponding edge or data samples from the delay chain. For example, an early edge sample 416, is selected based upon the address in early edge address 406, a data 1 sample 418 is selected based upon the address in data 1 address register 408, a middle edge sample 420 is selected based upon middle edge address register 410, a data 2 sample 422 is selected based upon data 2 address register 412 and a late edge sample 424 is selected based upon late edge address register 414. The data 1 and data 2 addresses are determined from the edge address registers. In particular, the data 1 address is calculated to be, for example, half way between the early and middle edge addresses, and the data 2 address is calculated to be, for instance, halfway between the middle and late edge addresses.

In accordance with one embodiment of the present invention, each selected sample contains 2 bits of data. In particular, each sample includes data captured on the falling edge and rising edge of the local clock (e.g., 106a) cycle (e.g., 10 nsec). These selected samples are passed to the appropriate edge detectors for comparison. For example, the early edge and data one samples are input to the early edge detector, the data one, middle edge and data two samples are forwarded to the middle edge detector, and the data two and late edge samples are passed to the late edge detector. The edge detectors compare the edge samples with the data samples and generate either up or down pulses, depending upon the results of the comparison. In particular, each edge detector makes two comparisons, one for the data bits detected during the falling edge clock cycle and one for the data bits detected during the rising edge.

For example, the early edge detector compares the data bit captured on the falling edge by early edge sample 416 to the data bit captured on the falling edge by data 1 sample 418. If the compares are equal, then the early edge detector would generate a down pulse. However, if they are unequal, then an up pulse would be generated. Similar comparisons are made by the early edge detector for those bits captured on the rising edge by early edge sample 416 and data 1 sample 418. After the two comparisons are complete, a determination is made as to whether a correction should be made to early edge address 406. If, for instance, an up and down pulse are generated, no correction is made. If, however, two up or down pulses are generated, then appropriate correction is made, as discussed further below.

Likewise, the late and middle edge detectors make similar comparisons as the early edge detector. The late edge detector compares the data bits sampled by data 2 sample 422 and late edge sample 424. If a data bit captured by the late edge sample compares equal to a data bit captured by the data 2 sample, then the late edge detector generates an up pulse. However, if a data bit of the late edge sample does not compare equal to a data bit of the data 2 sample, then the late edge detector generates a down pulse. After the two pulses (one for the data bits captured on the falling edge and one for the data bits captured on the rising edge) are computed, the appropriate address correction is made, as described herein.

The middle edge detector is shared between data window 1 and data window 2. Thus, the middle edge detector receives as input data bits from data 1 sample 418, middle edge sample 420 and data 2 sample 422. When data window 1 is active, the middle edge detector behaves as a late edge detector and when data window 2 is active, it behaves as an early edge detector.

The edge detector's function is to move the edge address to the point where it straddles the data bit's edge. Under steady state conditions, where the local clock (e.g., local clock 106a (FIG. 1)) is matched in frequency to the transmit clock (e.g., transmit byte clock of transceiver B) of the serial data, there are equal numbers of up and down pulses from the edge detectors, yielding no change in the edge address registers. However, when the frequency is not matched, then there is an unequal number of pulses and a change in one or more edge address registers needs to take place, as described below.

In accordance with the principles of the present invention, before applying the pulses to the edge address registers, the raw up and down pulses are first filtered by random walk filters 426. In one embodiment, a random walk filter is coupled to each edge address register. However, it is possible, in another embodiment, for one filter to be applied to all of the registers or any combination therebetween. Digital filtering is used to enhance the accuracy and performance of the DPLL. The random walk filters are programmable to allow maximum filtering when the amount of frequency drift (due to the frequency of the receive clock (e.g., receive byte clock of Transceiver A) compared to the transmit clock (of, for instance, Transceiver B) that launched the serial data) is small, and minimum filtering when the amount of frequency drift is large. In one example, the possible filtering values are 16, 32 and 64, indicating the net number of up or down pulses required to move the edge address value by one inverter, thereby tracking the frequency drift.

In one embodiment of the present invention, the amount of filtering applied by the random walk filters is further controlled by a selector, such as, for example, a beat frequency monitor 428. In particular, it is the beat frequency monitor that determines which of the possible filtering values (e.g., 16, 32, 64) is to be used by the random walk filters. The value chosen is based upon the amount of frequency drift, as indicated by, for instance, how frequently a wrap procedure (e.g., a wrap back or a wrap forward procedure, described below) occurs. In particular, the beat frequency monitor measures the time between wraps by monitoring the acknowledgements of the wrap procedures from, for instance, a DPLL control 430, which is coupled to beat frequency monitor 428. (DPLL control 430 is described in further detail below.) The greater the time between wraps, the slower the frequency drift and hence a larger filter value. Conversely, the shorter the time between wraps, the greater the frequency drift and hence a smaller filter value. Once the value is determined, it is sent to each of the random walk filters via a filter select signal.

In one embodiment, three ranges of frequency drift are anticipated: 0–100 ppm, 100–200 ppm, and >200 ppm. For minimum frequency drift, 0–100 ppm, the maximum filtering amount of 64 is used, and for moderate frequency drift, 100–200 ppm, the filtering amount is equal to 32. However, for a maximum frequency drift of >200 ppm, a non-symmetric filtering is employed to facilitate the rapid data window movement up and down the delay chain. For example, in a lead algorithm where a faster transmit clock causes only wrap back procedures to occur, the filtering is set to 16/32, where 16 up pulses from the edge detectors move the edge sample address, but 32 down pulses are needed to move in the opposite direction. In a lag algorithm where a slower transmit clock results in only wrap forward procedures, the filtering is reversed and set to 32/16.

The edge detectors allow the DPLL to track a serial data stream originating from a different clock source. With the edge detectors locked onto the edges of the data bits, the data address values (e.g., data 1 address and data 2 address) are simply calculated from the edge addresses. In the presence of frequency drift, the edge detectors follow the moving data edges and the data sample points are continuously calculated to be at the halfway point between two edges.

In the presence of frequency drift, the active data window (i.e., data window 1 or data window 2) may not be able to properly track the data, at a certain point. Thus, the DPLL of the present invention includes DPLL controls 430 used in determining the appropriate times for the active and inactive windows to be switched, thereby making the inactive window active and the active window inactive. These changes are based upon the addresses of the three edge detectors, which are input to DPLL controls 430. For instance, the position of the middle edge detector determines whether a transfer up (from active window 1 to window 2) or a transfer down (from active window 2 to window 1) is to take place. Similarly, when the early edge detector reaches inverter 0, a wrap forward procedure, described below, takes place and window 2 becomes the active window. Likewise, when the late edge detector reaches a position wherein the late address minus 2 times the middle address is a negative number (i.e., late−2×middle <0), a wrap back procedure takes place and window 1 becomes the active window. The transfer up, transfer down, wrap forward and wrap back procedures are described in further detail below.

In accordance with the principles of the present invention, a transfer up operation results from the transmit byte clock (TBC) in the transmitting node (e.g., TBC of transceiver B) being faster than the receive byte clock (RBC) in the receiving node (e.g., RBC of Transceiver A). In the presence of a faster transmit clock, the active data window (e.g., data window 1) would drift to the right. Then, at a predetermined point, (e.g., when the early address is at inverter 7 and about to be incremented by 1) a transfer up procedure occurs and the inactive window (e.g., data window 2) becomes the active window. During the transfer up procedure, the contents of the registers containing the address of the active data window are transferred to the appropriate registers for the newly activated data window (e.g., the address of the middle edge is transferred into the late address register and the address of the early edge is transferred into the middle address register). Thus, the newly activated data window (i.e., the current inactive window) is defined and locked onto prior to its use.

As time passes, window 2 (the now active window, in this example) continues to drift to the right until it reaches the upper end of delay chain 200. At this point, a wrap back procedure occurs and window 1 again becomes the active window. Prior to the wrap back procedure, the first (i.e., early) edge detector in conjunction with the second (i.e., middle) edge detector are employed to locate and lock onto window 1 well in advance of when the window needs to be used. In particular, as one example, following the transfer up procedure, which precedes a wrap back procedure, when the middle address (corresponding to the middle edge detector) is about to be incremented by one, the early address (corresponding to the early edge detector) is forced down to zero. Then, as window 2 continues to drift to the right leading up to the wrap back procedure, the early edge detector eventually finds its new edge as everything drifts to the right inside the delay chain. Thus, the inactive window 1 has been defined by the early and middle edge detectors prior to its use. This increases the accuracy of the data sample during the wrap procedure.

In the presence of a slower transmit clock, the active data window (e.g., data window 1) drifts to the left. If the active data window is already at the lower end of the delay chain (i.e., at inverter 0), then an immediate wrap forward procedure occurs and the inactive window (e.g., data window 2)

becomes the active window. Similar to the wrap back procedure, prior to the wrap forward procedure, the second (i.e., middle) edge detector in conjunction with the third (i.e., late) edge detector locate and define data window 2 well in advance of it being needed. In particular, in one example, following a transfer down procedure (described below), which precedes the wrap forward procedure, when the early address is about to be decremented by one, the late address (corresponding to the late edge detector) is forced up to an address equal to the middle address plus (the middle address minus the early address). This places the late edge address at approximately the right location to define the inactive window 2 using the middle and late edge detectors.

As time passes, the active window (e.g., data window 2) continues to drift to the left until a predefined point (e.g., when the middle address is at inverter 8 and about to be decremented by 1), where a transfer down procedure occurs and the inactive window (e.g., data window 1) becomes the active window. The transfer down procedure is similar to the transfer up procedure in that during the transfer down procedure, the contents of the registers containing the address of the active data window are passed to the appropriate registers for the soon to be activated data window. For example, the address of the middle edge is transferred into the early edge register and the address of the late edge is transferred into the middle address register.

The above procedures (i.e., transfer up, transfer down, wrap forward and wrap back) continue repeatedly and indefinitely as the DPLL tracks the incoming data stream. It is important for the data to be sampled from the valid active window. Thus, the output of DPLL controls 430 is input to a data mux 432 and middle edge detector 402. Based on the input from controls 430, the mux knows whether to select the data to be forwarded to the deserializer from data 1 sample or data 2 sample. Additionally, the middle edge detector knows whether to behave as a late edge detector (i.e., window 1 is active) or an early edge detector (i.e., window 2 is active).

The transfer up and transfer down procedures are transparent to the deserializer; however, in accordance with one embodiment of the present invention, the wrap procedures require a tight interlock between the DPLL and the deserializer. Thus, wrap requests are sent to the deserializer (e.g., deserializer 110a) from DPLL controls 430 (of, e.g., DPLL 112a) and acknowledgements are sent from the deserializer back to DPLL controls 430. This tight interlock is due to the fact that the deserializer produces a receive byte clock, (RBC) used in outputting the data to, e.g., the channel logic, that may be affected by the wrap procedures, as described below.

In one embodiment, the deserializer (e.g., deserializer 110a) receives two bits of retimed data from the DPLL each local clock cycle (e.g., a 10 nsec cycle), which are converted into parallel bits and assembled into, for instance, 10-bit bytes. Additionally, the deserializer produces from the 100 MHz local clock, a 20 MHz receive byte clock, which yields one 10-bit byte every 50 nsec RBC period, as one example. In the process of tracking the incoming data stream, the deserializer, in accordance with the principles of the present invention, periodically adds or subtracts one bit time from the RBC cycle time. For example, whenever the DPLL performs a wrap back procedure, the deserializer will shorten the RBC cycle by one bit time. Similarly, whenever the DPLL performs a wrap forward procedure, the deserializer will lengthen the RBC cycle by one bit time. Thus, during a wrap procedure, the deserializer presents 10 bits of data to, for instance, the ESCON channel in either 45 nsec or 55 nsec, depending on whether the incoming serial data is going faster or slower than the local clock on the transmit side (e.g., Transceiver B).

To synchronize the wrap events and maintain data integrity, the deserializer acknowledges a wrap request only at the end of an RBC cycle. In the wrap back case, where the RBC cycle is shortened by one bit time, an acknowledgement is sent from the deserializer to the DPLL informing the DPLL that the inactive data window is to be sampled to allow the deserializer to pick up an extra bit during the local clock cycle. For that particular clock cycle, three data bits are picked up from the DPLL. This is necessary, since during the wrap back procedure, one bit is lost. As an example, refer to FIG. 5, in which the two data windows are shown at various stages during a wrap back procedure. Assume, for example, that the incoming data stream includes the data bits shown in FIG. 5, in which the "a1" data bit is the oldest. Also, assume that the local clock has a 10 nsec cycle and 2 data bits are captured each 10 nsec clock cycle for the active window. Also, assume that, the current data bit in the active window, window 2, sampled on the falling edge of the local clock, is h1, and the next data bit in the data stream is located in the inactive window, window 1. Further, assume that a wrap back procedure has begun.

Figure 5:
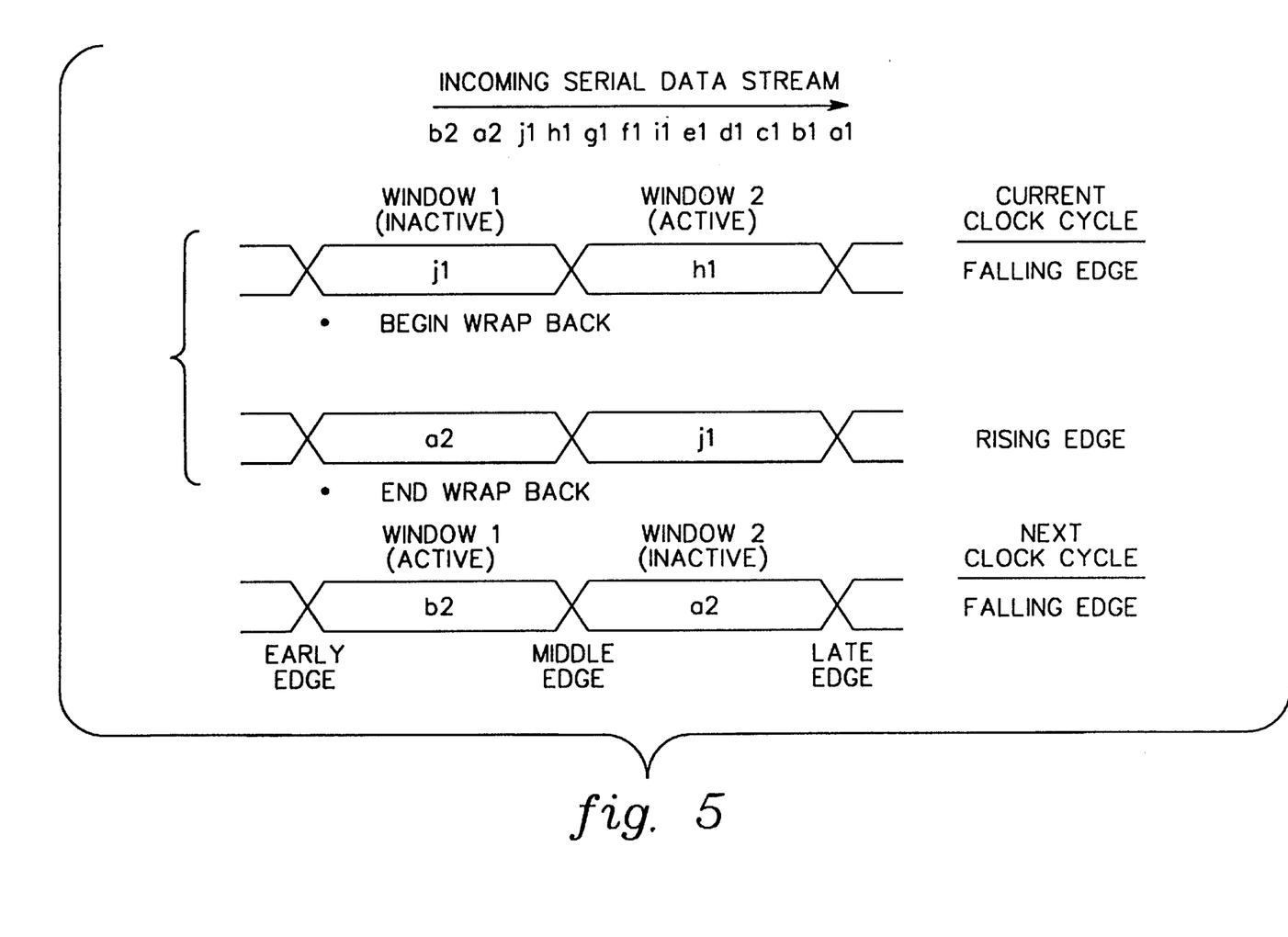
FIG. 5 illustrates one example of a wrap back procedure, in accordance with the principles of the present invention.

Next, on the rising edge of the clock, j1 is sampled in the active window and the wrap back procedure is complete. Therefore, at the end of the wrap back procedure, data bits h1 and j1 have been sampled and window 1 is now the active window. Thus, on the next clock cycle, a2 moves to window 2, which is inactive, and b2 is sampled. Thus, a2 was never in the active window to be sampled, and has been missed. Therefore, in order to avoid this data integrity problem, the a2 bit is sampled simultaneously with the h1 and j1 bits. That is, the a2 bit is inserted back into the data stream via, for instance, a hardwire to mux 432 of the DPLL.

In the wrap forward case, where one bit time is added to the RBC cycle, an acknowledgement is sent from the deserializer to the DPLL, informing the DPLL to present a particular bit twice. Specifically, this bit is sent via the hardwire to mux 432 of the DPLL. When the deserializer receives the extra bit, it discards it. One example of the wrap forward case is depicted in FIG. 6.

Figure 6:
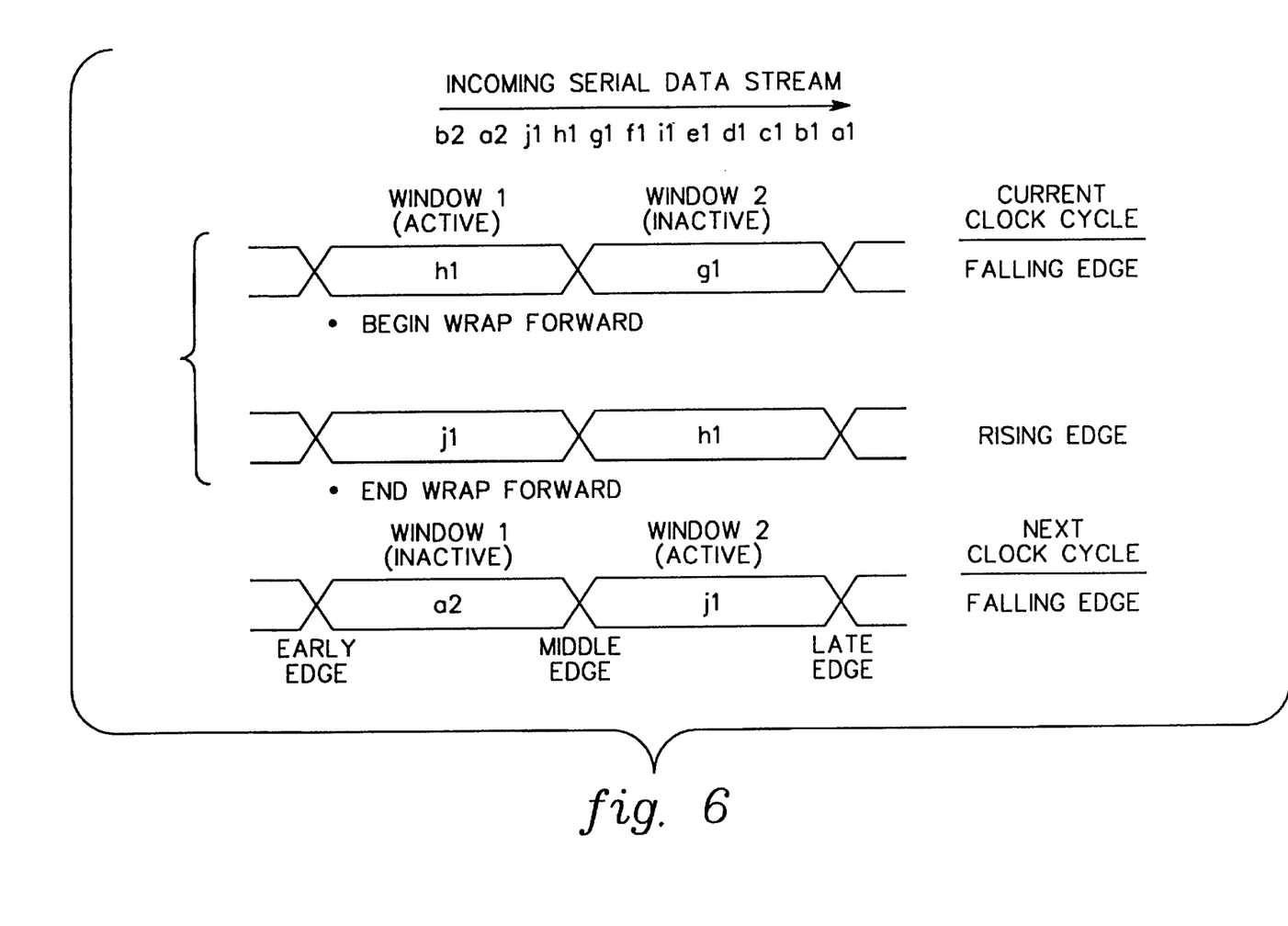
FIG. 6 illustrates one example of a wrap forward procedure, in accordance with the principles of the present invention.

In the example of FIG. 6, the active window is window 1 and the data bit located in window 2 has already been sampled. The serial data stream is the same as depicted in FIG. 5 and described above. On is the falling edge of the current clock cycle, h1 is sampled from the active data window 1. G1, which was previously sampled, is tracked by window 2. Additionally, the wrap forward procedure is commenced. Then, on the rising edge, j1 is sampled in the active window and h1 is tracked by window 2. Further, the wrap forward procedure is complete, making window 2 the active window.

At this time, h1 and j1 have been sampled. On the next clock cycle, j1 is tracked by window 2. However, since this is now the active window, j1 is sampled again. Thus, j1 needs to be discarded. In order for the deserializer to eliminate the extra j1 bit, it extends the receive byte clock by 1 bit time (e.g., 5 nsec), as described herein.

Further details of one example of the deserializer and receive byte clock are described below with reference to FIGS. 7–9.

Figure 7:
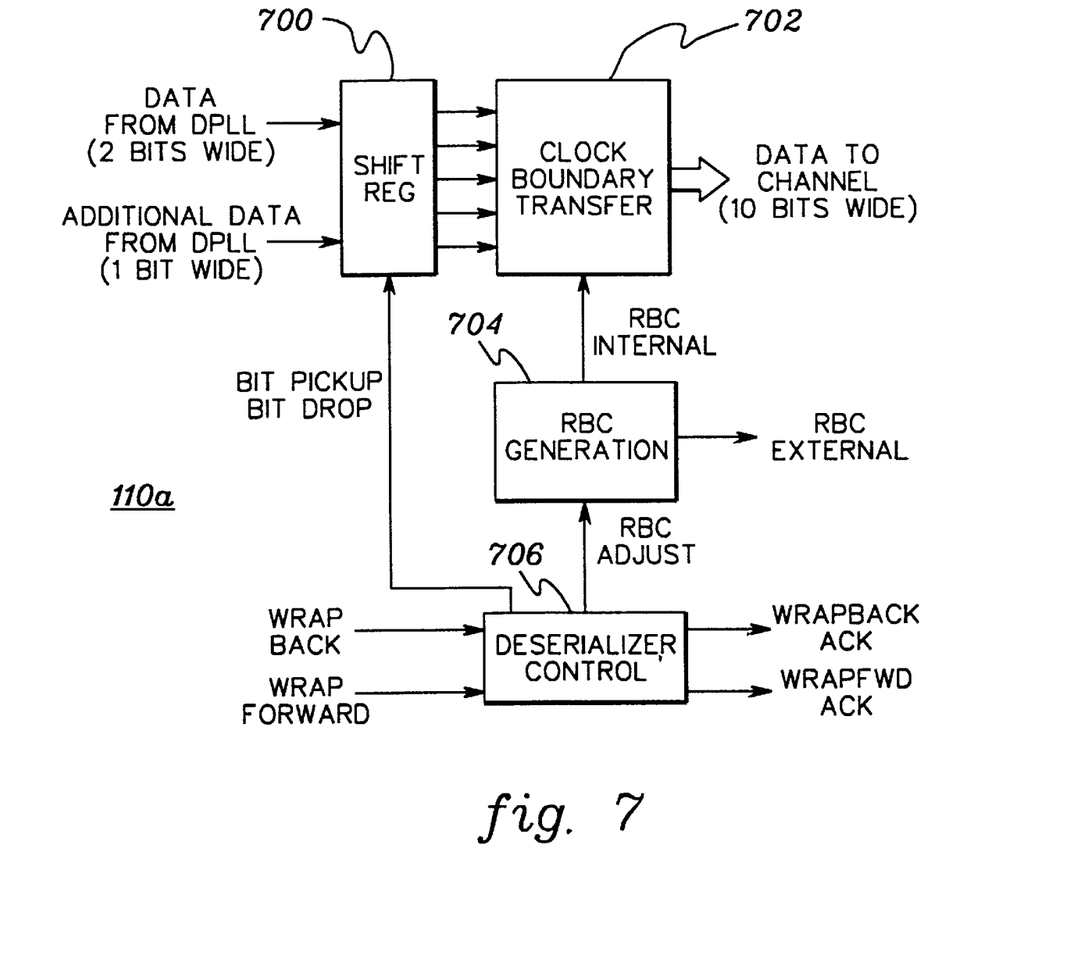
FIG. 7 depicts one example of a deserializer of the serial link of FIG. 1 incorporating the principles of the present invention.

One embodiment of a deserializer, such as, for instance, deserializer 110a, is depicted in FIG. 7. As one example, deserializer 110a includes a shift register 700, a clock boundary transfer register 702, a receive byte clock generation unit 704 and a deserializer control unit 706, each of which is described in detail below.

Shift register 700 includes, for example, a plurality of 2-bit registers used in receiving the 2-bit wide data samples from mux 432 of DPLL 112a. In particular, shift register 700 includes five 2-bit registers coupled to one another for receiving the 2-bit wide data samples. That is, every 10 nsec (i.e., the local clock cycle) shift register 700 receives a 2-bit data sample. Each 2-bit register holds a 2-bit data sample until five data samples are stored in register 700. Thereafter, the 10-bit wide data byte is clocked into clock boundary transfer register 702.

Furthermore, at the instance of a wrap back procedure, a control signal is generated by deserializer control 706 to instruct shift register 700 that an additional bit must be sampled from DPLL data mux 432. This facilitates sampling the third bit during a given local clock cycle, thus, allowing the RBC cycle to be shortened by one bit time, as described below.

Similarly, at the instance of a wrap forward procedure, a control signal is generated by deserializer control 706 to instruct shift register 700 that a single bit must be ignored from DPLL data mux 432. This facilitates sampling only one bit (as opposed to the usual two bits) during a given local clock cycle, thus, allowing the RBC cycle to be lengthened by one bit time.

As one example, clock boundary transfer register 702 takes 2 bits of data off of each of the five latches of shift register 700, in accordance with a receive byte clock internal signal, described below. Thereafter, the clock boundary transfer register outputs the 10-bit wide data byte to, for example, the ESCON channel, in accordance with the receive byte, clock (i.e., the RBC external signal). Byte synchronization (e.g., bit "a1" appearing in position "a1" of the parallel byte) is achieved by standard logic in the ESCON channel.

In accordance with one embodiment of the present invention, the RBC internal and external signals are generated by RBC generation unit 704. An input into RBC generation unit 704 is deserializer control unit 706, which is coupled to DPLL controls 430 of DPLL 112a. Deserializer control unit 706 receives each wrap request from the DPLL, and at a prespecified time, for instance, on a RBC cycle boundary, it forwards the appropriate acknowledgement (i.e., WRAPBACK or WRAPFWD) to the DPLL. Additionally, at the RBC cycle boundary, deserializer control unit 706 generates an adjustment (e.g., an up or down pulse) for RBC based on the wrap requests. For example, if the wrap request is a wrap back, then a down pulse is generated shortening the RBC by one bit time (e.g., 5 nsec). If, on the other hand, the wrap request is a wrap forward, then an up pulse is generated, lengthening the RBC by one bit time.

The RBC adjustment is input to RBC generation unit 704 and used in generating RBCI and RBC. Both RBCI and RBC have, for instance, 50 nsec clock cycles, however, RBC may be 180° out of phase from RBCI. This is due to the timing relationship that needs to be maintained between the local clock and RBCI in capturing the data from the 10 nsec local clock to the 50 nsec clock of the clock boundary transfer register. To ensure full valid data windows, RBCI is not adjusted on every wrap procedure, but instead on every other procedure by, for instance, two bit times (e.g., 10 nsec). Thus, during a wrap procedure, the RBCI cycle may have a value of 40, 50 or 60 nsec, making RBC, which has a value of 45 or 55 nsec during a wrap procedure, 180° out of phase following every other wrap procedure.

Figure 8:
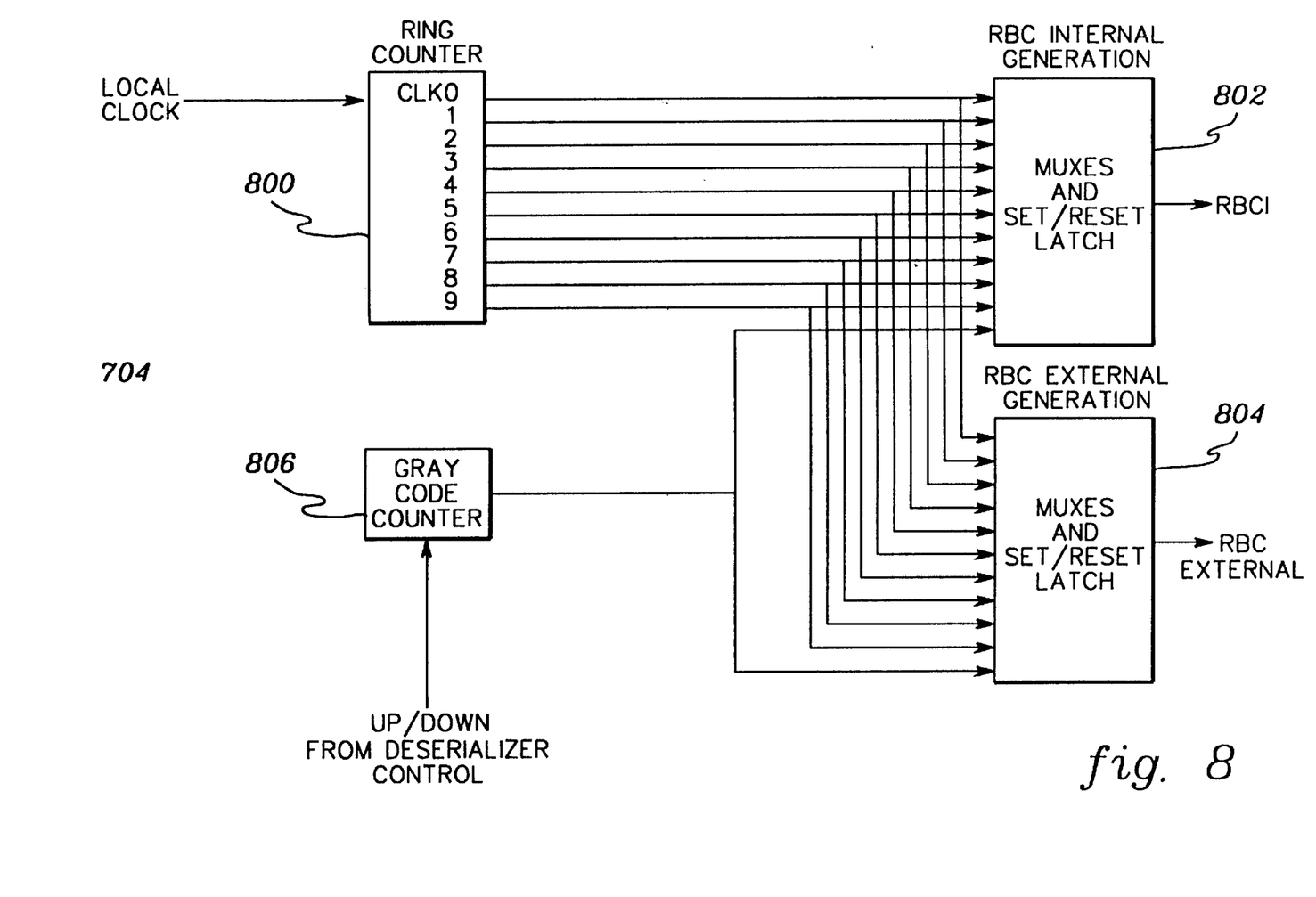
FIG. 8 depicts one example of a receive byte clock generation unit located within the deserializer of FIG. 7 and incorporating the principles of the present invention.
Figure 9:
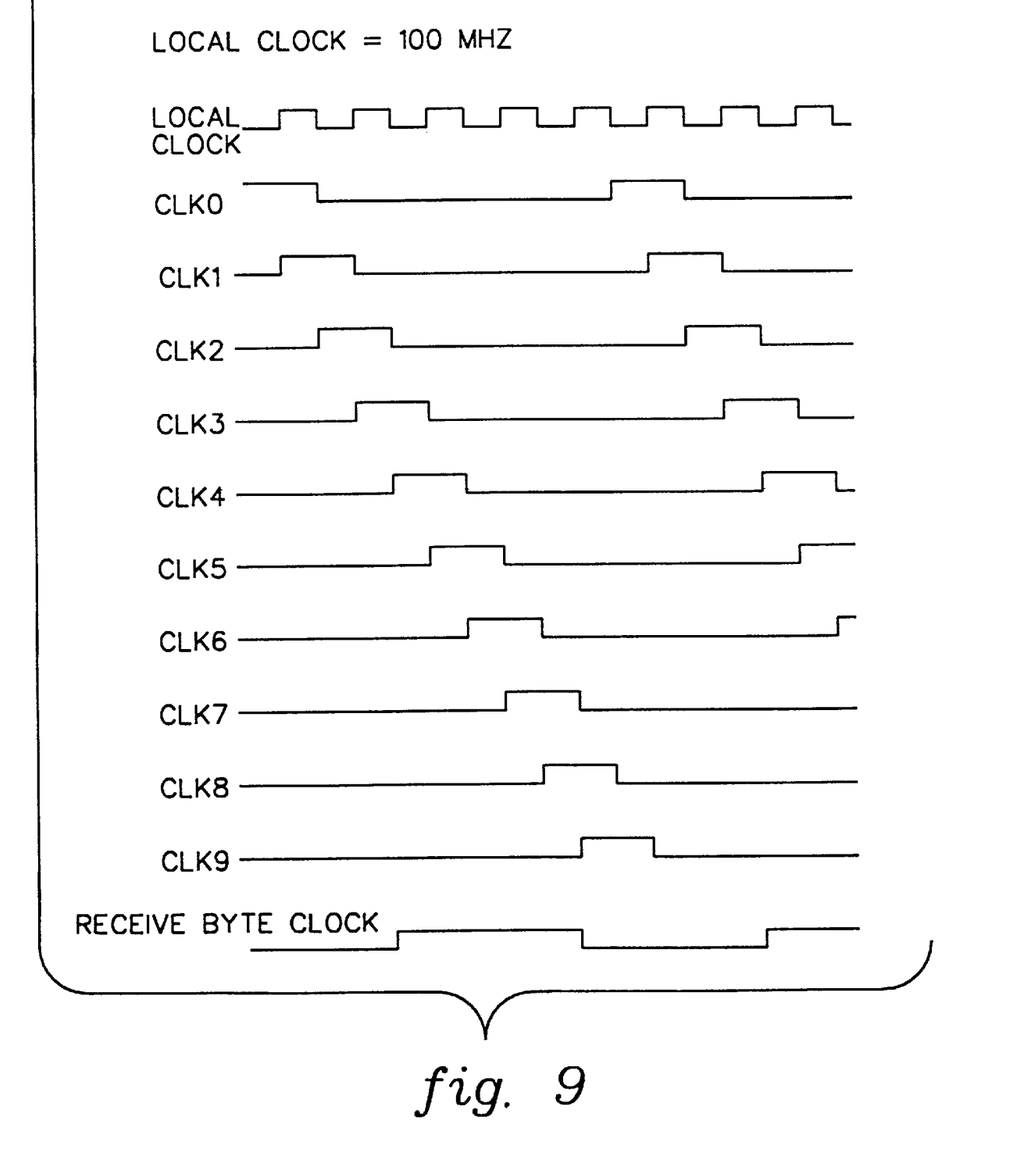
FIG. 9 illustrates one example of timing patterns for the local clock and receive byte clock of the present invention.

One example of RBC generation unit 704 is depicted in FIG. 8 and described in detail below. RBC generation unit 704 includes, for instance, a ring counter 800, a RBCI generation unit 802, a RBC external generation unit 804 and a gray code counter 806, each of which is described in detail below.

Ring counter 800 receives as an input the local clock, which, in one embodiment, has a frequency of 100 MHz and a cycle time of 10 nanoseconds. The ring counter produces, for instance, ten clock pulses (CLK 0–CLK 9), each of which is 10 nanoseconds wide and separated by 5 nanoseconds in time. The clocks are fed to RCBI generation unit 802 and RBC external generation unit 804, which are used to produce the internal and external receive byte clocks, respectively, as described below.

In one embodiment, each of the generation units includes one or more multiplexors and a set/reset latch used in setting and resetting the appropriately selected clock pulses. Additionally, the generation units have as an input a signal from gray code counter 806, which drives the controls to the multiplexors and latches.

Typically, the gray code counter selects a clock pair to produce a 50 nsec clock cycle having a 50% duty cycle. One example of this is shown in FIG. 9, in which CLK4 is selected to set the RBC external latch in generation unit 804, producing the rising edge of RBC, and CLK 9 is selected to reset that latch, producing the falling edge of a 50 nsec RBC cycle. For a given gray code, the same clocks will produce the opposite edges for the RBCI clocks—clock 4 resets the RBCI latch and clock 9 sets the RBCI latch.

However, the gray code counter selects a different pair of clocks when it is necessary to shorten or lengthen the clock cycle, due to a wrap request. For example, if an up pulse is received by the gray code counter, the gray code counter is incremented, thereby selecting CLK 5 instead of CLK 4, for the RBC set latch. Thus, the cycle time decreases to 45 nsec. Likewise, if a down pulse is received by the counter, then the counter is decremented, thereby selecting CLK 3, for the RBC set latch, thus, increasing the cycle time to 55 seconds. Thereafter, a new pair of ring clocks are selected to create the RBC clocks.

As with the RBC cycle, the RBCI cycle is similarly adjusted, however, it is adjusted by two bit times every other wrap procedure. In particular, a clock is selected from the odd ring counter clocks to set the RBCI S/R latch and another clock is selected from the even ring counter clocks to reset the RBCI S/R latch. Thus, adjusting the RBCI cycle by 2 bit times every other wrap procedure.

Described above in detail are a serial data stream recovery technique and apparatus, which use a local clock, asynchronous to the transmit clock of the serial data, to recover the serial data. The recovery apparatus of the present invention may include a DPLL and a deserializer.

In accordance with the principles of the present invention, the DPLL/deserializer of the present invention are included in a serial link in which only the data is shipped between a transmitter node and a receiver node. The receiver node recovers the data stream without relying on the benefit of any clock information from the transmitter node. The DPLL/deserializer's purpose is to recover the serial data stream at the receiver node, using a local clock which is totally asynchronous (within 200 ppm in frequency difference) to the remote transmit clock.

In addition to the above, the DPLL of the present invention includes two data windows defined by an early, a middle and a late edge detector. The early and middle detectors track the first data window and the middle and late detectors track the second data window. Data samples are taken from the midpoints of the windows.

The DPLL/deserializer of the present invention continuously track and recover the serial data without the need of any special timing patterns. It is the dual data windows that allows the DPLL/deserializer to continuously track the data by wrapping and transferring up and down between the two windows without ever having to interrupt data transmission between the nodes. The DPLL/deserializer transfer data from the host logic, a byte at a time, using the transmit byte clock to send data at a constant rate. The receive byte clock (RBC) also transfers data a byte at a time to the host logic, but RBC is periodically adjusted +/- one bit time each time the DPLL undergoes a wrap procedure to compensate for the frequency differences between the local clocks at each node.

Further, the DPLL/deserializer of the present invention advantageously achieve the speed and sensitivity desired to sample link data. The DPLL and deserializer, as well as the serializer, may be integrated on a low cost, single CMOS module meeting high performance standards.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An adaptive filtering method usable in the transmission and receipt of data, said method comprising:
   determining an amount of frequency drift between a first clock used in transmitting data and a second clock used in receiving said data, wherein said data comprises a plurality of data bits;
   selecting, responsive to said determining, a filtering value to be used in tracking said frequency drift; and
   tracking said frequency drift using a plurality of edge detectors, each of said plurality of edge detectors determining an edge of one of said plurality of data bits.

2. The method of claim 1, wherein said determining of said edge comprises providing, by said edge detector, an adjustment to an address of said edge, said providing employing said filtering value to determine when to adjust said address.

3. The method of claim 2, wherein said providing comprises providing said filtering value to a random walk filter prior to said adjustment, wherein said random walk filter determines when to adjust said address.

4. An adaptive filtering method usable in the transmission and receipt of data, said method comprising:
   determining an amount of frequency drift between a first clock used in transmitting data and a second clock used in receiving said data; and
   selecting, responsive to said determining, a filtering value to be used in tracking said frequency drift, wherein said selecting comprises selecting a minimum filtering value when said frequency drift is determined to be large and a maximum filtering value when said frequency drift is determined to be small.

5. An adaptive filtering method usable in the transmission and receipt of data, said method comprising:
   determining an amount of frequency drift between a first clock used in transmitting data and a second clock used in receiving said data, wherein said data comprises a plurality of data bits;
   selecting, responsive to said determining, a filtering value to be used in tracking said frequency drift; and
   adjusting an address of one or more data bits of said plurality of data bits to track said frequency drift, said adjusting comprising using said filtering value to determine when to adjust said address of said one or more data bits.

6. An adaptive filtering apparatus comprising:
   means for determining an amount of frequency drift between a first clock used in transmitting data and a second clock used in receiving said data, wherein said data comprises a Plurality of data bits;
   a selector coupled to said means for determining, said selector adapted to select, responsive to said determining, a filtering value to be used in tracking said frequency drift; and
   a plurality of edge detectors adapted to track said frequency drift, each of said plurality of edge detectors being adapted to determine an edge of one of said plurality of data bits.

7. The apparatus of claim 6, wherein each of said plurality of edge detectors is further adapted to provide an adjustment to an address of said edge of said one of said plurality of data bits, wherein said filtering value is employed to determine when to adjust said address.

8. The apparatus of claim 7, further comprising a random walk filter programmable to receive said filtering value prior to said adjustment, wherein said random walk filter is further programmable to determine when to adjust said address.

9. An adaptive filtering apparatus comprising:
   means for determining an amount of frequency drift between a first clock used in transmitting data and a second clock used in receiving said data; and
   a selector coupled to said means for determining, said selector adapted to select, responsive to said determining, a filtering value to be used in tracking said frequency drift, wherein said selector comprises means for selecting a minimum filtering value when said frequency drift is determined to be large and a maximum filtering value when said frequency drift is determined to be small.

10. An adaptive filtering apparatus comprising:
    means for determining an amount of frequency drift between a first clock used in transmitting data and a second clock used in receiving said data, wherein said data comprises a plurality of data bits;
    a selector coupled to said means for determining, said selector adapted to select, responsive to said determining, a filtering value to be used in tracking said frequency drift; and
    means for adjusting an address of one or more data bits of said plurality of data bits to track said frequency drift, said means for adjusting comprising said filtering value to be used in determining when to adjust said address of said one or more data bits.

11. An adaptive filtering apparatus comprising:
    a monitor adapted to determine an amount of frequency drift between a first clock used in transmitting data and a second clock used in receiving said data, wherein said data comprises a plurality of data bits;
    a selector adapted to select, responsive to the determining, a filtering value to be used in tracking said frequency drift; and
    a plurality of edge detectors adapted to track said frequency drift, each of said plurality of edge detectors being adapted to determine an edge of one of said plurality of data bits.

12. The apparatus of claim 11, wherein said monitor and said selector are included in one unit.

13. the method of claim 1, wherein said second clock is not transmitted with or extracted from said data.

* * * * *